INVENTORS
John R. Burgess &
Peter E. Pflaumer
BY
Gordon H. Telfer
ATTORNEY

Feb. 25, 1969 J. R. BURGESS ET AL 3,430,104

CONDUCTIVE INTERCONNECTIONS AND CONTACTS ON SEMICONDUCTOR DEVICES

Filed Sept. 30, 1964 Sheet 2 of 2

3,430,104
CONDUCTIVE INTERCONNECTIONS AND CONTACTS ON SEMICONDUCTOR DEVICES

John R. Burgess, Ellicott City, and Peter E. Pflaumer, Baltimore, Md., assignors to Westinghouse Electric Corporation, East Pittsburgh, Pa., a corporation of Pennsylvania Filed Sept. 30, 1964, Ser. No. 400,504
U.S. Cl. 317—101 6 Claims
Int. Cl. H01l 5/00, 3/00

ABSTRACT OF THE DISCLOSURE

Semiconductor device structures, and methods for their fabrication, are disclosed having thereon a contact and conductive interconnection combination including an intermediate layer, such as one of at least 10% chromium, between the ohmic contact metal, such as aluminum, and the conductive lead, such as gold, to avoid undesirable metallurgical reactions.

This invention relates generally to semiconductor devices with contacts and conductive interconnections between portions of the surface. The invention has particular pertinence to semiconductor integrated circuits and methods for their fabrication.

In the fabrication of semiconductor integrated circuits, in which the functions of a plurality of individual, conventionally interconnected, components are provided within a unitary body of semiconductive material, it has been a practice to employ aluminum for ohmic contacts to the semiconductive material since ohmic contacts having good electrical and mechanical characteristics may be made to both p and n+ (highly doped n type) regions. It has also been a practice to employ aluminum, conveniently deposited in the same operation as that for the ohmic contacts, for conductive interconnections between elements of the structure. The conductive interconnections are disposed on the surface of an insulating material, commonly silicon dioxide. Part of the interconnection configurations are areas commonly referred to as bonding pads where gold wire is bonded by a technique often called ball bonding or nail-head bonding. The gold wire is then subsequently bonded to the posts or leads that extend to the exterior of the integrated circuit package. The use of gold wire is desirable because, as formed, it adheres well to the bonding pad and the bonding operation requires only moderate operator skill to perform.

In the foregoing system aluminum and gold are in direct contact in the bonding pad area. It has been found that these metals react, under certain conditions at an accelerated rate, to form a product that is electrically insulating and mechanically weak. After a period of time, depending on environmental conditions, the bond fails.

The precise nature and mechanism of the reaction between aluminum and gold is not thoroughly understood at present and an exact understanding of it is not necessary for the successful practice of the present invention. It has been suggested that it is, chemically, $AuAl_2$. It may be the case that the reaction product also includes some of the semiconductive material itself. It seems that at least the rate of reaction is accelerated when semiconductive material such as silicon is present. As the product formed has a dark color, often purple, it is commonly referred to as "purple plague."

While it is believed that the reaction forming purple plague proceeds even at room temperature, it is not particularly harmful until the reaction is accelerated by heating the device to high temperatures, particularly temperatures higher than 200° C. Even though the device may be heated to such a temperature for only a short time, the reaction appears to proceed until failure occurs and such devices are generally characterized by relatively short useful life.

It is difficult to avoid the use of high temperatures in the manufacturing process itself. The gold wire bonding operation itself is carried out at wafer temperatures in excess of 200° C. and the lidding of the semiconductor device package is conventionally performed at temperatures in excess of 300° C.

The approach that has been previously taken for solution to the problem of purple plague is to replace either the gold or aluminum in the system. However, such proposals have encountered other problems that make them not fully satisfactory. For example, one provides for the substitution of aluminum wire for the gold wire. This has been found to present difficulties in bonding to the device as aluminum wire is not amenable to conventional nail-head bonding. Poor bond strength, even if great care is taken in bonding, is the common result. Even ultrasonics have been used in an effort to strengthen the bond but this has been a time-consuming and low yield process.

It is, therefore, an object of the present invention to provide a semiconductor device, and method of making the same, that avoids the problem of purple plague.

Another object is to provide a semiconductor device, and method of making the same, that permits the use of aluminum ohmic contacts and gold wire leads while avoiding undesirable metallurgical reactions in the system.

Another object is to provide an improved method of manufacturing semiconductor devices, particularly integrated circuits, that have increased reliability and a long life even at temperatures at least as high as 300° C.

The invention, in brief, achieves the above-mentioned and additional objects and advantages thereof by providing a semiconductor device structure that includes an aluminum layer, bonded to the semiconductive material and providing an ohmic contact thereto, a gold layer and an intermediate electrically conductive layer disposed between and in conductive contact with both the aluminum and gold layers that substantially prevents reaction between the gold and aluminum at temperatures under 300° C. The intermediate layer is of metal including at least about 10% by weight chromium. For example, substantially pure chromium is suitable as are nickel alloys that include about 10% to 50% by weight chromium.

In accordance with the method of the present invention, the various layers are successively deposited in vacuum and selectively removed to provide the desired contact and interconnection pattern. It has been found especially advantageous to deposit at least the intermediate layer onto the aluminum layer prior to bonding the aluminum to the semiconductive material.

The present invention together with the above-mentioned and additional objects and advantages thereof will be better understood by reference to the following description taken in connection with the accompanying drawing, wherein:

FIGS. 3A, 3B and 3C are successive views illustrating the practice of the present invention in part of the structure of FIG. 2, wherein FIGS. 3A and 3C are perspective views and FIG. 3B is a sectional view.

Figure 1:
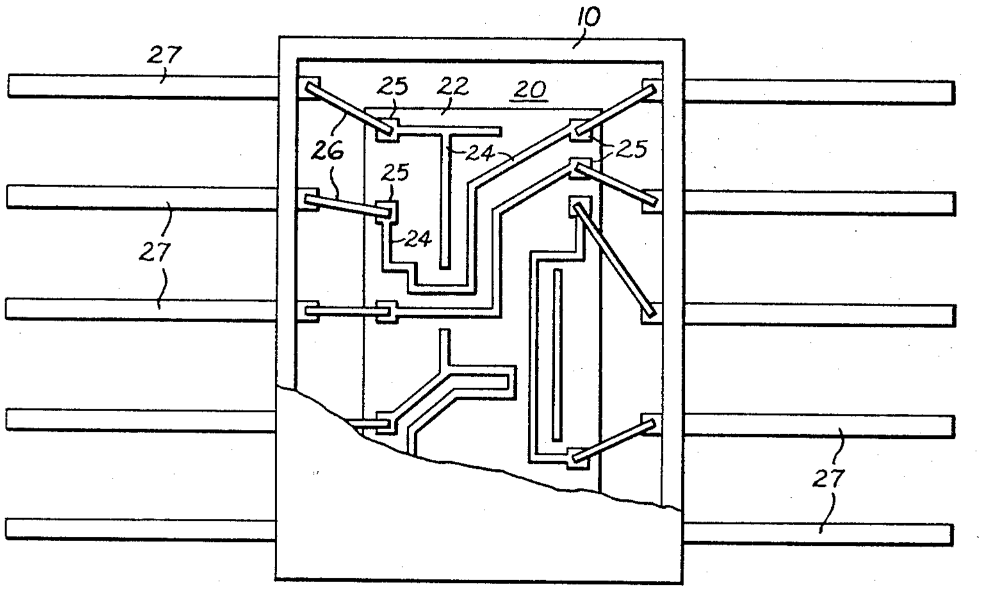
FIG. 1 is a plan view, partially broken away, of a packaged semiconductor integrated circuit that may advantageously embody the present invention.

FIG. 1 is representative of the type of devices, generally known to the prior art, upon which the present invention improves. In an enclosure 10, often referred to as a flat package, a semiconductor integrated circuit 20 is disposed. The integrated circuit 20 comprises a body of semiconductive material 22, that has various regions (not specifically shown) that provides the functions of a plurality of conventional components such as transistors, diodes, capacitors and resistors. The regions of the body 22 are joined in a circuit by a pattern 24 of ohmic contacts and conductive interconnections, the latter being of a conductive layer or film that is disposed on the body 20 but insulated by a layer of insulating material from it. The conductive interconnections terminate at bonding pads 25 to which wires 26 are bonded. The wires 26 join the integrated circuit 20 to flat leads 27 that extend in coplanar fashion from the flat package 10. The leads 27 are used to join the integrated circuit in position for use, such as on a printed circuit board.

Figure 2:
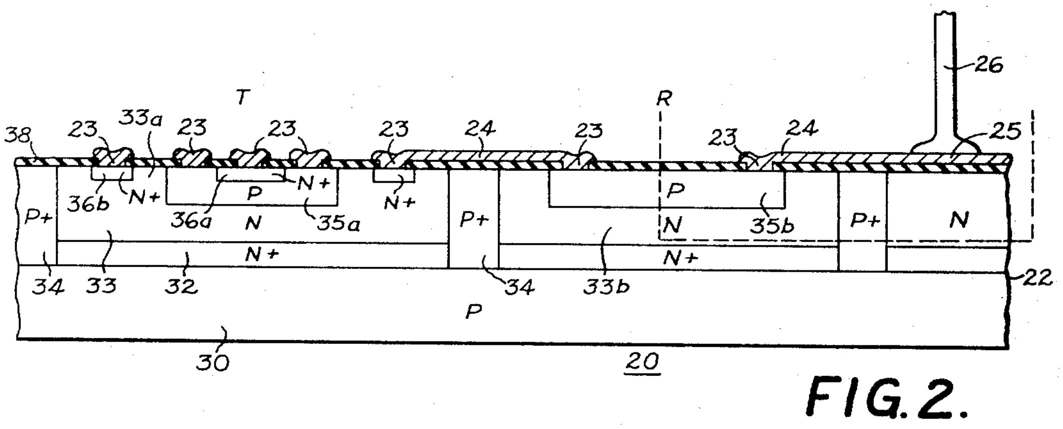
FIG. 2 is a partial, sectional, view of a circuit of the type suitable for the practice of the present invention.

Referring now to FIG. 2, a portion of integrated circuit 20 is set forth to show an example of the application of the present invention. It is to be understood that the invention may be applied in any semiconductor device where aluminum contacts and gold lead wires are desired to be used. The particular geometry of the structures of FIGS. 1 and 2 are merely shown for purposes of an example.

FIG. 2 shows a p type substrate 30 on which successive n+ and n type layers 32 and 33 of epitaxial material are disposed. Isolation walls 34 diffused through the epitaxial layers 32 and 33 create discrete regions of n type material **33*a* and 33*b*** in which the functional elements of the integrated circuit are formed.

In the illustrated structural portion there is shown a transistor structure T and a resistor structure R. The transistor structure T in the left-hand portion of the structue includes p type base and n+ emitter regions **35*a* and 36*a*, respectively, successively diffused into the isolated n type region 33*a* that serves as the collector region. The resistor structure R includes a p type region 35*b* diffused into the isolated n type region 33*b* of the epitaxial layer. Region 35*b* is conveniently diffused at the same time as region 35*a***.

Ohmic contacts 23 are made to each of the emitter and base regions **36*a* and 35*a* in the transistor structure, and to an n+ region 36*b* diffused in the collector region 33*a* so aluminum may be used for the contact material. Contacts to regions 35*a* and 36*b* are in the form of a ring. Ohmic contacts 23 are also formed at the extremities of the diffused p type region 35*b*** that provides resistive functions.

The surface of body 22 is covered by an insulating passivating layer 38, conveniently of silicon dioxide, through which the contacts 23 extend to the semiconductive material. In this example, the collector region **33*a* of the transistor structure is connected to the resistive region 35*b* by means of a conductive interconnection 24 that extends over the passivating layer 38. Also, the other end of the resistive region 35*b* has a conductive interconnection 24 extending over the adjacent passivating layer 38 to a bonding pad 25 to which a lead wire 26** is bonded. Of course, a typical complete integrated circuit includes numerous other device contacts, interconnections and bonding pads.

As described in the introduction, it has previously been a practice to employ aluminum as the material for the ohmic contacts 23 and interconnections 24, including bonding pads 25, and to use gold wire for the lead wire 26. In accordance with the present invention, the advantages of using aluminum ohmic contacts and gold wires are retained while also improving reliability and lifetime by including an intermediate metal layer that prevents the undesirable reaction of gold and aluminum.

Figure 3A:
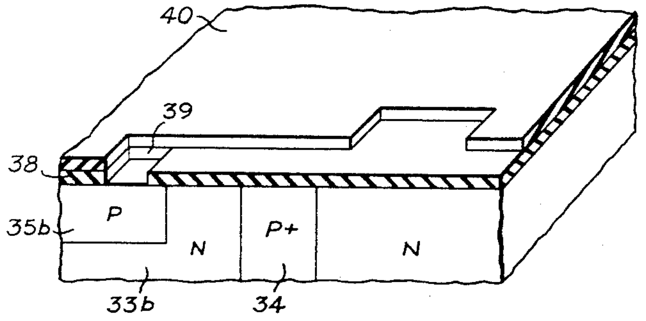

The present invention will be better understood by reference to the method of making it described in connection with FIGS. 3A to 3C. Each of these figures illustrates the portion of the structure enclosed by the dotted line of FIG. 2 at successive stages in the fabrication process. In FIG. 3A the structure is shown after all of the doped regions such as **33*b*, 35*b* and 34 have been formed and the surface passivating layer 38 has been formed over the surface with openings or windows 39 where contacts to the semiconductive material are desired. The techniques of diffusion, oxidation and forming a window in an oxide layer are well known and will not be described herein. Over the oxide layer 38 there is disposed a layer 40 of a masking material that may conveniently be one of the commercially available photoresist materials exposed and developed by conventional means to provide a pattern of openings that coincide with the openings 39 in the oxide layer 38** and also coincide with the desired position of conductive interconnections and bonding pads.

Figure 3B:
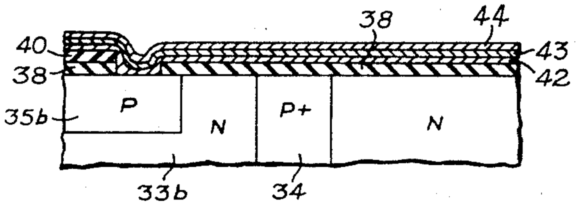

FIG. 3B illustrates the structure after successive layers 42, 43 and 44 of aluminum, a nickel alloy containing chromium and gold, respectively, have been disposed over the entire surface of the structure and fill the openings in the oxide and masking layers 38 and 40.

Figure 3C:
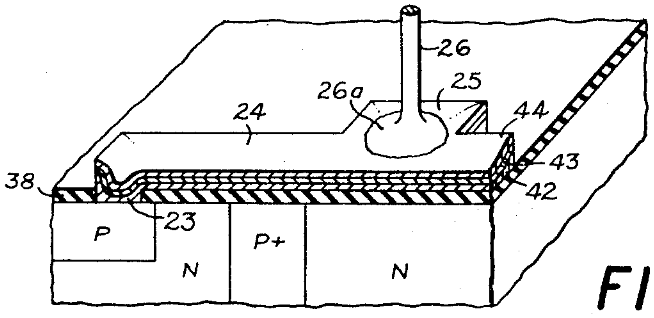

FIG. 3C illustrates the structure after the masking material has been removed, for example by ultrasonic agitation, consequently also removing the portions of the metal layers 42, 43 and 44 that are disposed on the masking material. The desired ohmic contact and interconnection pattern 24 thus remains on the structure.

Throughout the operations just described, the structure is not permitted to be heated to a temperature greater than that which the masking material 40 will withstand without deleterious effect, typically about 150° C. Thus, to this point, the structure has not been heated so as to bond the aluminum layer 42 to the semiconductive material.

The aluminum bonding is then performed by heating the structure to near the silicon-aluminum eutectic temperature of 577° C. The ohmic contact 23 is therefore formed.

Then a gold wire 26 is bonded to the bonding pad portion 25 of the interconnection pattern by nail-head bonding. The structure is heated to a temperature above 200° C. and the end of a gold wire is brought in contact with the bonding pad 25 where it forms a ball, or nail head, **26*a* that adheres to the gold layer 44**.

In the structure of FIGS. 3A to 3C, the aluminum layer 42 should have a thickness sufficient to insure good ohmic contact to the semiconductive material. The minimum thickness required for this purpose is about 200 angstroms. The thickness of the aluminum layer 42 may suitably be within the range of from about 200 angstroms to about 7000 angstroms though the maximum thickness is not critical.

The nickel-chromium alloy layer 43 should have a thickness sufficient to prevent gold migration through it to the aluminum which would result in formation of the purple plague and eventual device failure. For this purpose the nickel-chromium layer 43 should have a minimum thickness of about 500 angstroms. The thickness of the layer 43 may suitably be within the range of from about 500 angstroms to about 2000 angstroms though, here again, the maximum thickness is not critical.

A certain minimum thickness of the gold layer 44 is required so as to permit bonding the gold wire to it without causing gold penetration of the intermediate layer 43 which would bring the gold and aluminum layers in contact. For this purpose a minimum thickness of about 2000 angstroms is necessary. The thickness of the gold layer may be suitably within the range of from about 2000 angstroms to about 5000 angstroms though the maximum thickness of the gold layer 44 is, also, not critical.

To provide sufficient total conductivity within the interconnection structure, the gold layer is made thick if the aluminum layer is relatively thin. Thus, the total thickness of the aluminum and gold layers 42 and 44 should be at least about 4000 angstroms.

In the practice of the present invention as described in connection with FIGS. 3A to 3C, the nickel-chromium alloy selected for use may conveniently be any of the commercially available nickel-chromium alloys such as those sold under the trademarks Nichrome, Inconel, and Chromel. Such alloys have compositions that include, with nickel, at least 10% by weight chromium. Typically they comprise about 10% to 20% by weight chromium and about 60% to about 90% by weight nickel. Additional metals such as iron, may be present in the alloy as may a small amount of carbon, as occurs in some Nichrome alloys. Such additional materials are not desirable, however, as they may reduce conductivity and may have detrimental metallurgical reactions.

During deposition of the nickel-chromium alloy by vacuum evaporation it is believed, because of the difference in their vapor pressures, that the deposited film is high in nickel content initially and that its composition gradually increases in chromium content. The interface between the aluminum layer 42 and the nickel-rich portion of the nickel-chromium layer 43 is metallurgically stable below about 640° C. The interface between the chromium-rich portion of the nickel-chromium layer 43 and the gold layer 44 is stable up to about 340° C.

During the practice of the method as described in FIGS. 3A to 3C, the nickel-chromium layer provides an additional advantage over the use of pure chromium, which is also suitable, in that the nickel-chromium layer may be evaporated at a lower temperature, typically about 800° C.

The aluminum and gold layers 42 and 44 should each be substantially pure. That is, only trace impurities of less than about 1% by weight should be present. Purer metals are preferred for good electrical and mechanical properties and to avoid metallurgical reactions.

Following is described a more specific example of the practice of this invention in accordance with FIGS. 3A to 3C. An oxide mask 38, having contact windows, and the photoresist stencil 40 were applied to the wafer in accordance with conventional techniques. The wafer was then cleaned by ionic bombardment from a glow discharge in a vacuum chamber.

A 500 angstrom film of aluminum was deposited uniformly over the wafer by evaporating in a vacuum of about $1\times10^{-6}$ mm. of mercury. The aluminum was 99.999% pure and was carried on an electrically heated tungsten filament, heated to about 610° C.

Subsequent to the aluminum deposition, a 1500 angstrom film of Nichrome alloy having a composition of about 10% chromium and 90% nickel, by weight, was similarly deposited. The Nichrome evaporation required a temperature of about 800° C.

About 4000 angstroms of gold was then deposited by the same sort of vacuum evaporation requiring a source temperature of about 850° C.

The wafer was then placed in an ultrasonic generator where the photo-resist stencil 40 was removed by agitation thus leaving the desired contact and interconnection pattern.

The wafer was then heated to about 565° C. to bond the aluminum to the semiconductive material. Subsequently, gold wire bonding was performed to join wires to the interconnection pattern.

Figure 4A:
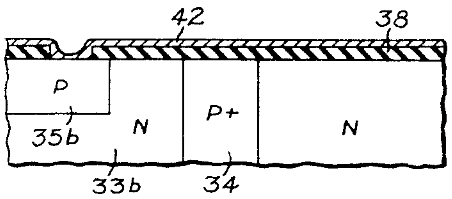
FIGS. 4A to 4D are partial sectional views of part of the integrated circuit structure of FIG. 2 showing successive stages in the practice of an alternative form of the present invention.
Figure 4C:
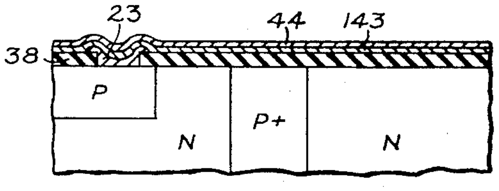
Figure 4B:
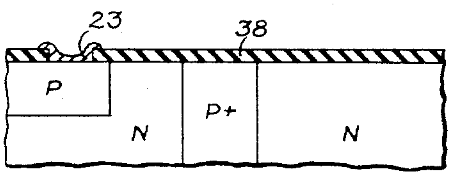

Referring now to FIGS. 4A to 4D, an alternative manner of practicing the present invention is illustrated. In FIG. 4A is shown the same portion of the integrated circuit structure of FIG. 2 as is shown in FIG. 3A. On the surface of the wafer is an oxide layer 38 as previously described. No masking material is employed. There is first deposited over the oxide layer 38 the aluminum layer 42 making contact with the semiconductive material where openings are provided in oxide layer 38. The aluminum layer 42 is selectively removed, for example by photoresist masking and chemical etching, except where it is disposed within the contact windows, as shown in FIG. 4B.

Figure 4D:
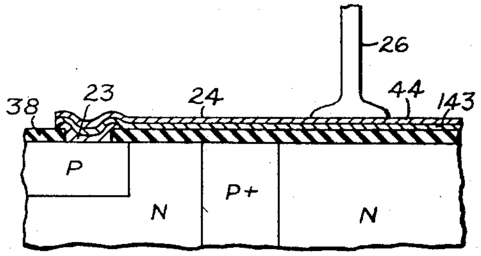

The aluminum is then bonded to the semiconductive material by heating to form a contact 23 that is electrically ohmic. FIG. 4C shows the structure after forming the ohmic contact 23. Also, a layer 143 of substantially pure chromium has been deposited over the entire surface and a layer 44 of substantially pure gold over the chromium layer. The layers 143 and 44 are also selectively etched or otherwise physically removed to form the desired interconnection pattern 24 as shown in FIG. 4D. A gold wire 26 is also shown bonded to gold layer 44.

In this form of the invention, the aluminum and gold layers 42 and 44 may be the same as described in connection with FIGS. 3A to 3C. The chromium deposition to form layer 143 is similar to that of the nickel-chromium alloy for previously described layer 43 with a few significant exceptions. Here it is necessary to use a higher source temperature, such as about 1900° C., for the chromium to evaporate. Also, the wafer must be heated to about 500° C. to 550° C. to break through the oxide layer that forms on the aluminum during the bonding of the ohmic contact 23.

The chromium layer 143 may suitably have a thickness as described for the nickel-chromium layer 43.

It will be appreciated that in accordance with the present invention, evaporation techniques are not essential as other means for vacuum deposition, such as sputtering may be used to obtain a uniform layer of the desired thickness.

Devices in accordance with this invention are suitable for gold wire bonding at temperatures above 200° C. without deterioration of the contact or interconnection system. Other manufacturing operations may be performed at elevated temperatures, for example, the package 10 (FIG. 1) in which the integrated circuit is contained may be sealed at a temperature of about 300° C. or somewhat higher using a gold alloy preform.

The interconnection scheme in accordance with the present invention is advantageously applied to both semiconductor and hybrid integrated circuits. In the latter, the features of aluminum ohmic contacts to semiconductive material and the ability to use gold wire are preserved. In addition, the gold layer, such as layer 44 in FIGS. 3B or 4C is quite suitable as a substrate for or part of resistive and capacitive elements formed by thin films of material deposited thereon.

While the present invention has been shown and described in a few forms only, it will be understood that various changes and modifications may be made without departing from the spirit and scope thereof.

What is claimed is:

1. A semiconductor device comprising: a body of semiconductive material; a layer of insulating material disposed on said body of semiconductive material, said layer of insulating material having a plurality of openings therein to permit contacting said semiconductive material; conductive means extending from within one of said openings over a portion of said layer of insulating material to a point of termination on said layer of insulating material, said conductive means comprising an aluminum layer disposed on and bonded to said semiconductive material within said opening, a gold layer on the exposed upper surface of said conductive means, an intermediate layer disposed between said aluminum and gold consisting essentially of metal that does not react with said aluminum and gold at temperatures under 300° C.; a conductive lead consisting essentially of gold bonded to said gold layer.

2. A semiconductor device in accordance with claim 1 wherein: said intermediate layer is of metal including at least about 10%, by weight, of chromium.

3. A semiconductor device in accordance with claim 1 wherein: said intermediate layer is an alloy including, by weight, 60% to 90% nickel and 10% to 20% chromium.

4. A semiconductor device in accordance with claim 3 wherein said aluminum layer extends throughout said conductive means.

5. A semiconductor device in accordance with claim 1 wherein: said intermediate layer consists essentially of chromium.

6. A semiconductor device in accordance with claim 5 wherein said aluminum layer is limited in extent essentially to said opening.

References Cited

UNITED STATES PATENTS

| | | | |
|---|---|---|---|
| 3,138,744 | 6/1964 | Kilby | 317—101 |
| 3,197,710 | 7/1965 | Lin | 317—101 |
| 3,256,587 | 6/1966 | Hangstefer | 317—101 |
| 3,256,588 | 6/1966 | Sinika et al. | |
| 3,271,635 | 9/1966 | Wagner. | |
| 3,290,753 | 12/1966 | Chang. | |

LARAMIE E. ASKIN, *Primary Examiner.*

J. R. SCOTT, *Assistant Examiner.*

U.S. Cl. X.R.

29—195; 148—187; 317—234.